United States Patent [19]

Yazawa

[11] Patent Number: 5,028,867
[45] Date of Patent: Jul. 2, 1991

[54] PRINTED-WIRING BOARD

[75] Inventor: Yoshiaki Yazawa, Niigata, Japan

[73] Assignee: Nippon Seiki Co., Ltd., Niigata, Japan

[21] Appl. No.: 401,302

[22] Filed: Aug. 31, 1989

[51] Int. Cl.$^5$ .......................... G01R 31/00; G01B 7/00
[52] U.S. Cl. ................................... 324/158 R; 33/645
[58] Field of Search .............. 324/73 PC, 158 R, 73.1, 324/158 F; 174/68.5, 266; 33/645; 430/8, 22, 30

[56] References Cited

U.S. PATENT DOCUMENTS

| | | | |
|---|---|---|---|
| 3,859,711 | 1/1975 | McKiddy | 174/68.5 |
| 4,432,037 | 2/1984 | Brabetz | 324/73 PC |
| 4,510,446 | 4/1985 | Braun et al. | 324/73 PC |

Primary Examiner—Ernest F. Karlsen
Attorney, Agent, or Firm—Lowe, Price, Leblanc, Becker & Shur

[57] ABSTRACT

In a printed-wiring board produced by arranging a plurality of wiring circuit patterns on a printed-wiring board by screen printing and cutting out product regions corresponding to the wiring circuit patterns by punching them along the circumferences of the product regions, the printed-wiring board according to the present invention comprises deviation detecting patterns for determining whether or not the condition of deviation of the printed pattern is within an allowable limit, the deviation detecting patterns being printed at the time of the screen printing of the wiring circuit patterns in the vicinity of the position of the cut plane of the board for each product region of each wiring circuit pattern. Thereby, it is made possible to easily determine whether or not the condition of the pattern deviation is within a specified allowable limit.

2 Claims, 5 Drawing Sheets

PRINTED-WIRING BOARD

BACKGROUND OF THE INVENTION

1. Field of the Invention

The present invention relates to a printed-wiring board having a plurality of columns of wiring patterns formed by screen printing and more particularly to a printed-wiring board in which deviation of pattern is adapted to be effectively detected.

2. Description of the Prior Art

In the manufacture of printed-wiring boards by screen printing, holes for through-hole connection are made in the board with the surface of the hole plated with copper, a plurality of columns of circuit patterns are printed on both front and rear surfaces, and copper on the unnecessary portions other than the circuit patterns are removed by etching. Then, a mask pattern formed of a resist layer is printed on the board, reference holes for punching work are made therein, and then a plurality of printed-wiring boards are obtained by punching work.

With such printed-wiring boards manufactured by the screen printing method, there is a problem that expansion or shrinkage of the screen affects the dimensions and accuracy of the wiring pattern.

When such a screen printing method is used, the screen easily expands or shrinks due to changes in the temperature and humidity, or the screen becomes expand as it is used many times. Thus, deviation of the pattern is easily produced particularly in the type of screen having a plurality of columns of wiring patterns.

Further, in the case where a plurality of wiring circuit patterns having circular arc patterns are arranged on a printed-wiring board by the use of the screen printing method and the outer circumference of the product region corresponding to each wiring circuit pattern and the central portion of the circular arc pattern are punched so that the product is cut out to be concentric with the circular arc pattern, deviation the circular arc pattern with respect to the center of the circular arc is liable to be produced in the product.

In the past, the deviation of the pattern due to expansion of the screen was checked by visual inspection of the operator so that the screen producing large deviation of the pattern was replaced with new one, However, since there was no means to accurately determine occurrence of the pattern deviation by visual inspection, it was often the case with such a prior art method that the time to replace the screen was lost and the use of the expanded screen was continued even when the pattern deviation exceeded its allowable limit, and therefore, there was a problem that a large number of defective products were produced.

SUMMARY OF THE INVENTION

The present invention was made in view of the above described problems encountered in the prior art. Accordingly, an object of the present invention is to provide a printed-wiring board with which it is made easy to detect the deviation of the printed wiring circuit pattern occurring in the printed-wiring board to be cut by punching.

BRIEF DESCRIPTION OF THE DRAWINGS

FIG. 1 is a front view showing patterns printed on the surface of a board;

FIG. 2 is a front view showing patterns printed on the rear surface of the board of FIG. 1;

FIG. 3 is a front view of an entire board showing a state where a plurality of columns of the patterns shown in FIG. 1 are printed thereon;

FIG. 4 is a front view of a punched printed-wiring board; and

FIG. 5 is a front view of a blank after being subjected to punching work.

DETAILED DESCRIPTION OF THE PREFERRED EMBODIMENTS

A preferred embodiment of the present invention will be described below with reference to accompanying drawings.

Figure 1:
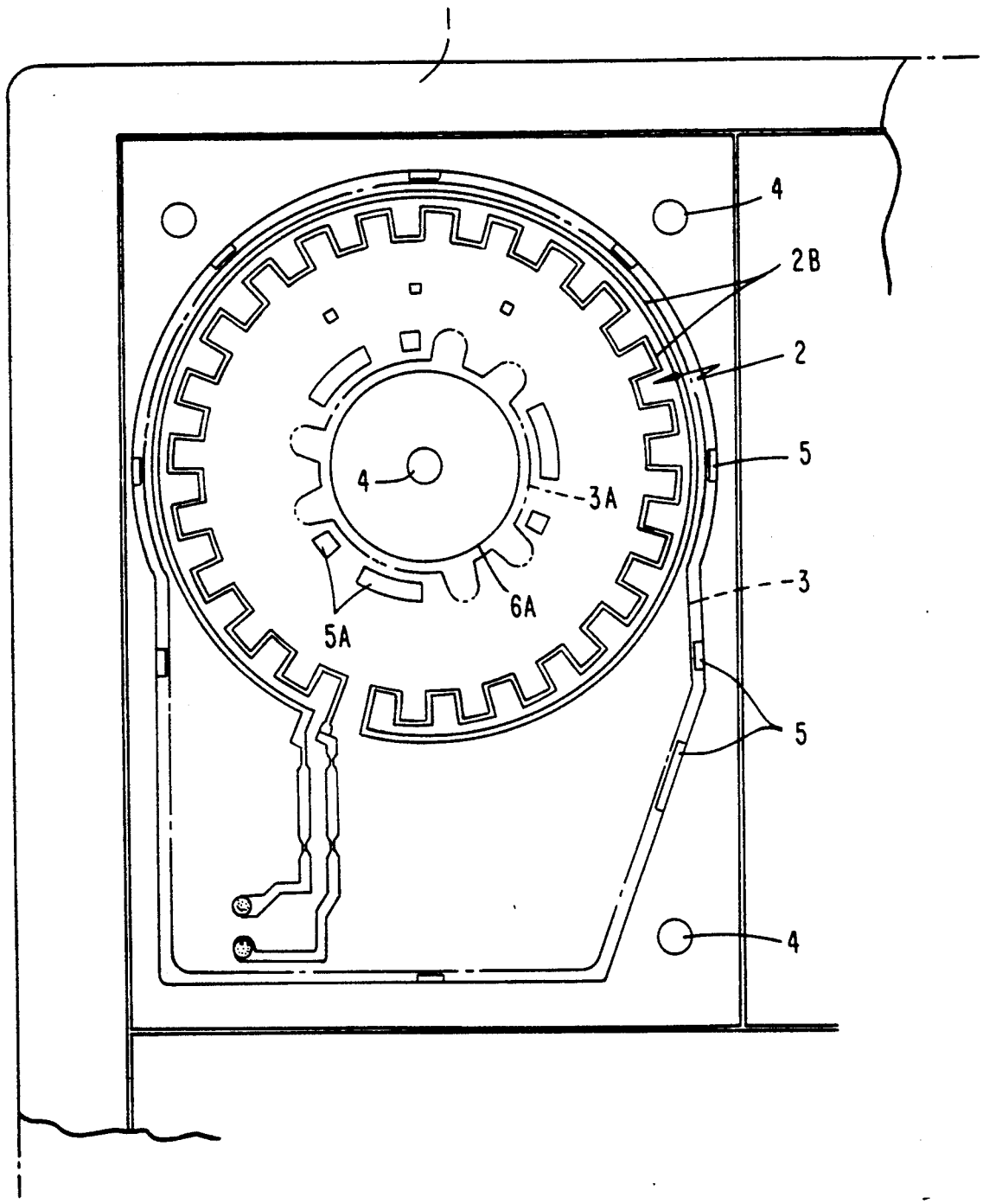
FIG. 1 to FIG. 5 are drawings showing embodiments of the present invention.
Figure 2:
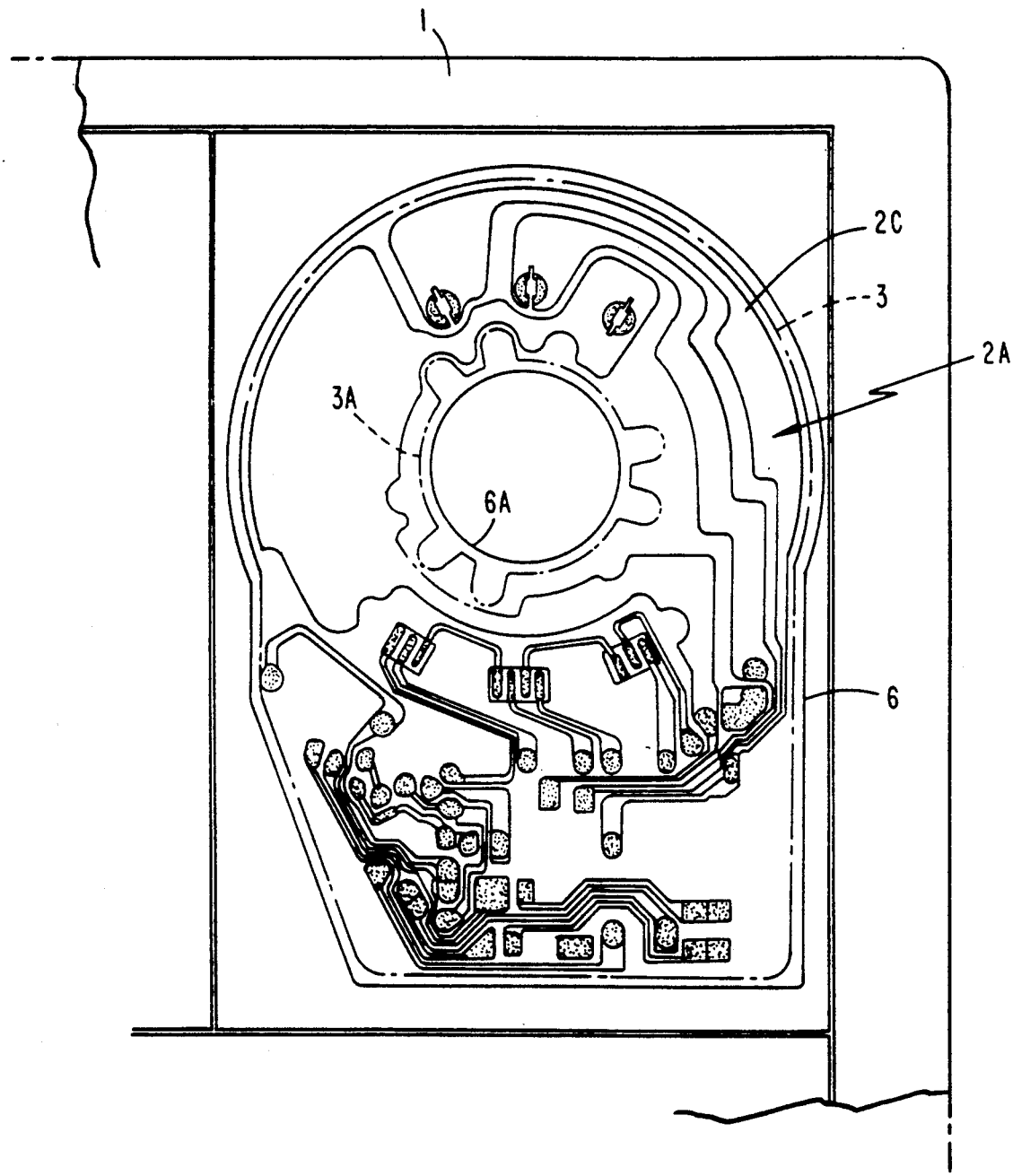
Figure 3:
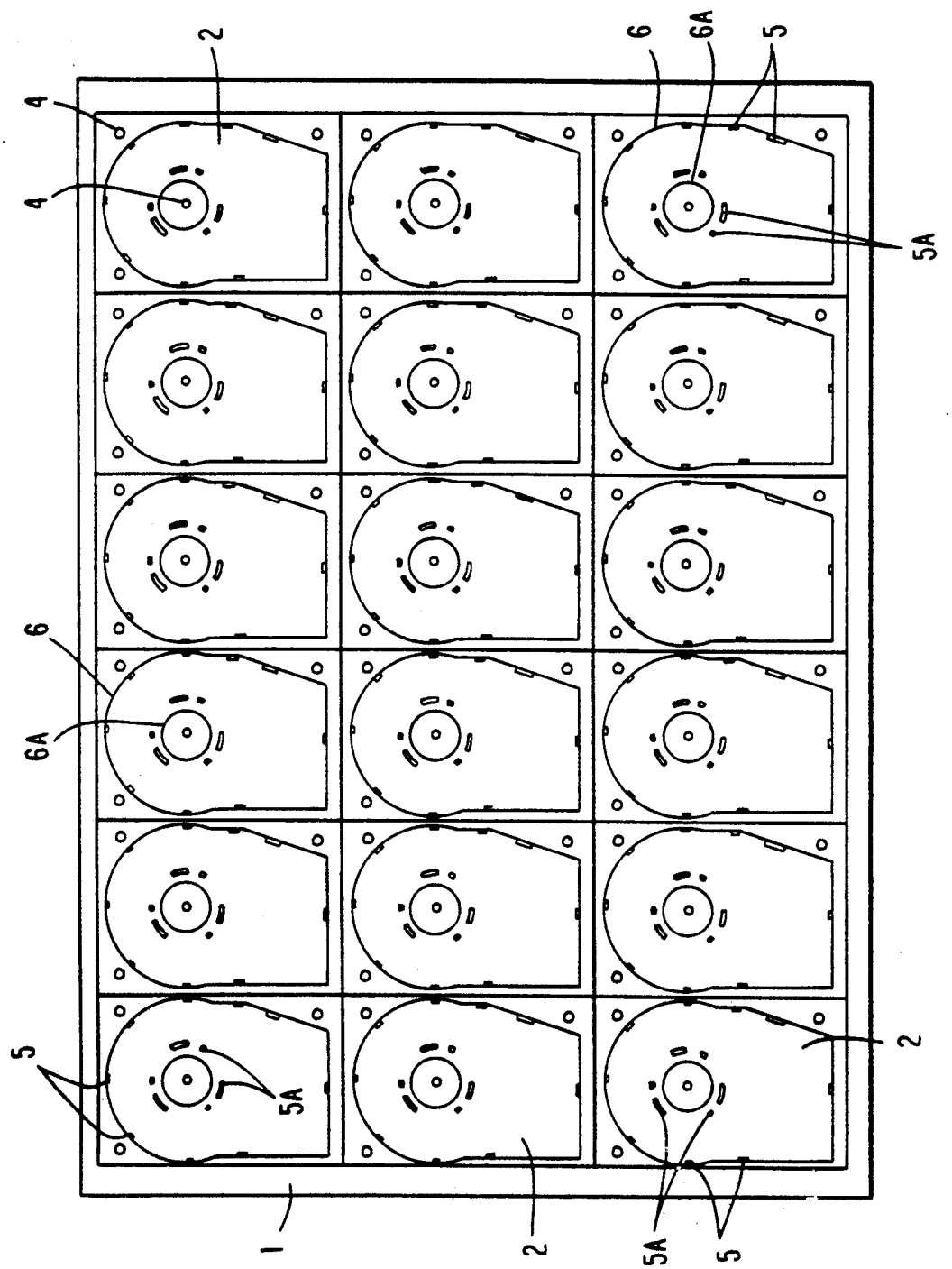

FIG. 1 to FIG. 5 show a printed-wiring board as a control circuit of a motor, in which reference numeral 1 denotes a printed-wiring board. On the front surface of the printed-wiring board 1, there are printed as shown in FIG. 3 a plurality of wiring patterns 2 of FIG. 1, and on the rear surface thereof, there are printed a plurality of columns of wiring patterns 2A as shown in FIG. 2 corresponding to the above described wiring patterns 2. Reference numerals 3 and 3A denote cutting lines indicated by dash-and-dot lines along which the board 1 with the wiring patterns 2, 2A formed thereon is punched, and the portion between the cutting lines 3 and 3A consitutes a product region on the board 1. Reference numerals 4 denote reference patterns for reference holes for punching work printed on portions on the board 1 outside the product region. By boring holes at the portions of the reference patterns 4, the reference holes 4A are made in the board.

In the present embodiment, there are printed reference patterns 4 at three portions on the board 1 outside the product region, i.e., on the outer side of the cutting line 3, and at one portion on the board 1 in the internal non-product region, i.e., on the inner side of the cutting line 3A.

Reference numerals 5 denote a plurality of deviation detecting patterns printed on the outer side of the cutting line 3, becoming the outer circumference of the product region, on the surface of the board 1, and 5A denote a plurality of deviation detecting patterns printed on the product region on the side toward the interior of the cutting line 3A, which becomes the inner circumference of the product region. In the present embodiment, each of the deviation detecting patterns 5 and 5A is formed with a spacing corresponding to the allowable limit for the pattern deviation from the center of the product region, i.e., the position of the reference line referenced from the position of the cutting line 3, 3A. Reference numeral 6 denotes an outer circumferential line of a mask pattern formed of a resist layer and 6a denotes an inner circumferential line of the same. The mask patterns printed on the interior of the outer circumferential line 6 and the inner circumferential line 6A cover the wiring patterns 2, 2a and the detecting patterns 5, 5A.

By known screen printing, the wiring patterns 2, the reference patterns 4, and the deviation detecting patterns 5, 5A are printed on the surface of the board 1 at the same time, and the wiring patterns 2A are printed on the rear surface of the board 1, each of the wiring patterns 2, 2A and the deviation detecting patterns 5, 5A is covered with a mask pattern, holes are made at the portions of the reference pattern 4 whereby the reference holes 4A for punching work are made, and all the product regions are simultaneously punched along the cutting lines 3, 3A with the reference holes 4A used as the reference. Then, the distance between the cut line 7 of each printed-wiring board 1A as the punched product region and the deviation detecting patterns 5, 5A is checked for determining whether or not the printed-wiring board 1A is good as a product.

When the distance between the cut line 7 and the deviation detecting pattern 5, 5A, or the pattern deviation, is larger than the allowable limit, the screen is replaced with a new one.

In the present embodiment as described above, the printed-wiring board 1 is provided with deviation detecting patterns 5, 5A for checking for pattern deviation formed at the circumferential portions of each of a plurality of columns of wiring patterns 2. Hence, by only checking the distance between the cut line 7 of each printed-wiring board 1A after being punched and the deviation detecting patterns 5, 5A, it is made possible to accurately and easily determine whether or not the condition of the pattern deviation is within a specified allowable limit, and thereby, it is prevented that the time for replacing the screen is lost.

The present invention is not limited to the above described embodiment but various modifications can be made without departing from the spirit and scope of the present invention. For example, the deviation detecting patterns may be formed at either of the outer circumferential portion and the inner circumferential portion, and the deviation detecting pattern may be continuously formed along the entire circumference of the product region or a plurality of the same may be formed at suitable positions along the circumference.

In the above described embodiment, there are formed a plurality of wiring patterns 2 having circular arc patterns 2B on the surface of the board 1 as shown in FIG. 1, and there are printed a plurality of wiring patterns 2A having circular arc patterns 2C, corresponding to the wiring pattern 2, on the rear surface of the board 1 as shown in FIG. 2.

Figure 4:
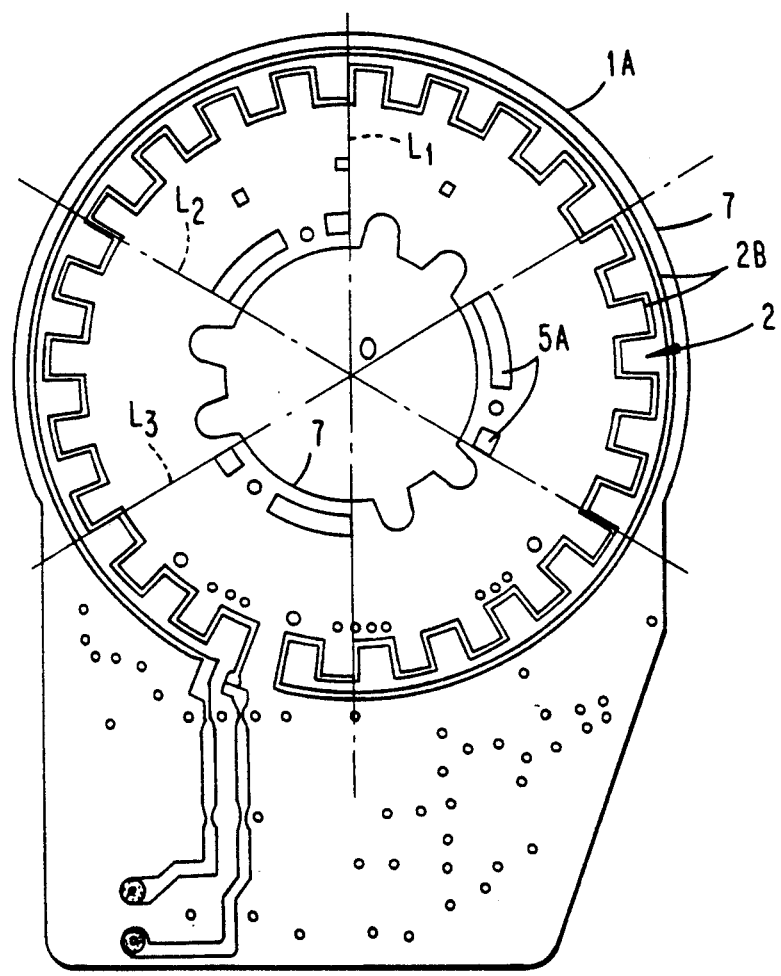
Figure 5:
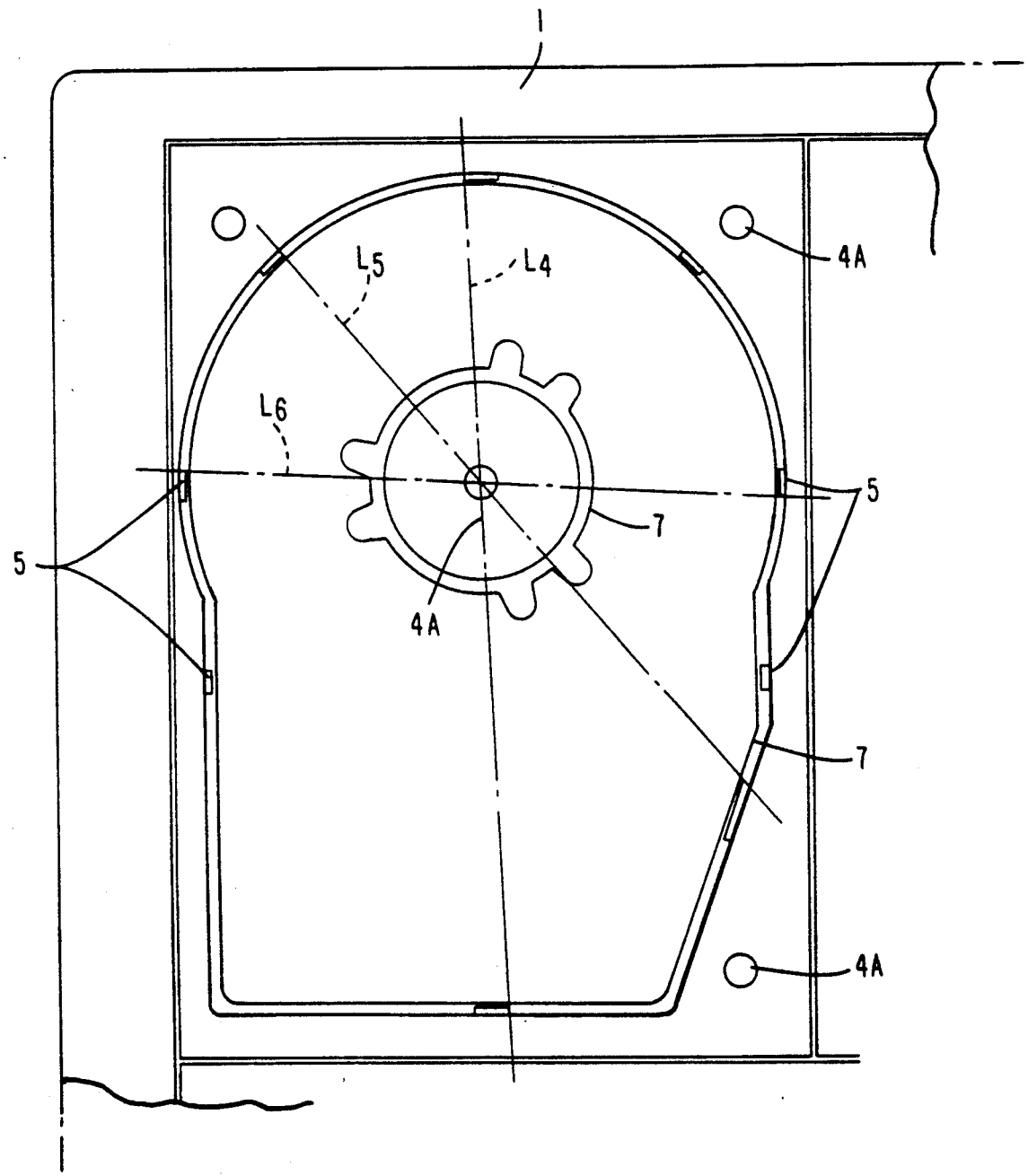

The deviation detecting patterns 5A are printed at concentric positions with the circular arc patterns 2B such that side ends of each pair of opposing deviation detecting patterns 5A are positioned along imaginary center lines $L_1$, $L_2$, $L_3$ of the circular arc patterns 2B as shown in FIG. 4, and the deviation detecting patterns 5 are printed at concentric positions with the circular arc patterns 2B such that side ends of each pair of opposing deviation detecting patterns 5 are positioned along imaginary center lines $L_4$, $L_5$, $L_6$ of the circular arc patterns 2B as shown in FIG. 5.

By the known screen printing, the wiring patterns 2 having the circular arc patterns 2B, the reference patterns 4, and the deviation detecting patterns 5 and 5A are simultaneously printed on the surface of the board 1 and the wiring patterns 2A having the circular arc wiring patterns 2C are printed on the rear surface of the board 1, and then, the wiring patterns 2 and 2A and the deviation detecting patterns 5 and 5A are covered with mask patterns. Then, the portions of the reference patterns 4 are bored so that the reference pattern holes 4A for punching work are made, and, with the reference holes 4A used as the reference, all the product regions are simultaneously punched by cutting the outer circumferences of the product regions and central portions of the circular arc patterns 2B and 2C along the cutting lines 3 and 3A, respectively, and thereby, the manufacture of the printed-wiring boards 1A for the motor control circuit as the product are completed.

At this time, the board 1A is punched to have a predetermined profile, and also, a fixing hole is made by punching its central portion so that the punched fixing hole of the board 1A may be put on a bearing cylinder of a motor in a fit manner. Further, the generating coil of a frequency of a predetermined pattern provided by the circular arc patterns 2B disposed on the board 1A and the rotor of the motor are aligned to be concentric.

Thus, when the circular arc patterns 2B come out of concentricity, the alignment of the frequency generating coil constituted of the circular arc patterns 2B with the rotor becomes poor, and thereby, a problem is posed that controlling of the rotating speed of the rotor sometimes becomes inaccurate.

In the present invention, however, whether the printed-wiring board 1A is good or not as the product is arranged to be determined on the basis of the imaginary center lines $L_1$, $L_2$, or $L_3$ obtained by means of the side end portions of the opposing deviation detecting patterns 5A, or the imaginary center lines $L_4$, $L_5$, or $L_6$ obtained by means of the side end portions of the deviation detecting patterns 5. More particularly, when the deviation of the distance between the position of the cut line 7 on the imaginary center line $L_1$, $L_2$, $L_3$, $L_4$, $L_5$, $L_6$ and the side end portion of the deviation detecting patterns 5, 5A exceeds the allowable limit, the screen is replaced with a new one.

Thus, in the above described embodiment, there are disposed deviation detecting patterns 5 and 5A on the inner side or outer side of each product region of a plurality of wiring circuit patterns 2 arranged on a printed-wiring board 1 by screen printing, such that the deviation detecting pattern 5, 5A is positioned along at least one imaginary center line of the circular arc patterns 2B and concentrically with the circular arc patterns 2B. Therefore, only by measuring the distance between the position of the circular cut line 7 along the imaginary center line as a reference line obtained from the side end portion of the deviation detecting pattern 5, 5A and the position of the side end portion of the deviation detecting pattern 5, 5A, the determination whether or not the condition of the pattern deviation is within a specified allowable limit can be accurately and easily made, and thereby, it is avoided to lose the time for replacement of the screen.

The present invention is not limited to the above described embodiment but various modifications can be made without departing from the spirit and scope of the present invention. For example, provision of at least two deviation detecting patterns corresponding to one imaginary center line will be enough, and the deviation detecting patterns may be provided only on the exterior side or on the interior side of the cutting lines 3, 3A or on both the sides.

What is claimed is:

1. A printed-wiring board assembly comprising a printed wiring board substrate including a product region and non-product regions defined by cut lines; wiring circuit patterns formed by silk screening on an external surface of said printed wiring board substrate in said product region; said wiring circuit patterns having circular arc patterns on said substrate; said cut lines being disposed along the outer circumference of the product region and along the circumference of central portions of said circular arc patterns; a plurality of deviation detecting patterns formed on said external surface of said printed wiring board substrate by said silk screening for determining whether or not the condition of deviation of the printed pattern is within an allowable limit, said deviation detecting patterns being disposed on said surface of said printed wiring board substrate in the vicinity of the position of the cut lines so as to be located along at least one imaginary center line of said circular arc patterns and at concentric position with said circular arc patterns, wherein the distance between the cut lines and said deviation detection patterns are indicative of whether the wiring circuit patterns are within said allowable limit.

2. A printed wiring board assembly according to claim 1 wherein at least one of said deviation detecting patterns is printed within the product region and at least one of said deviation detecting patterns is printed on a non-product region.

* * * * *